United States Patent
Lee et al.

(10) Patent No.: US 10,630,217 B2
(45) Date of Patent: Apr. 21, 2020

(54) APPARATUS AND METHOD FOR CONTROLLING INVERTER FOR DRIVING MOTOR

(71) Applicants: HYUNDAI MOTOR COMPANY, Seoul (KR); KIA MOTORS CORPORATION, Seoul (KR)

(72) Inventors: Yong Jae Lee, Hwaseong-Si (KR); Tae Won Ha, Suwon-Si (KR); Su Hyun Bae, Daegu (KR); Ho Joon Shin, Suwon-Si (KR); Sung Kyu Kim, Bucheon-si (KR); Joo Young Park, Yongin-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/197,882

(22) Filed: Nov. 21, 2018

(65) Prior Publication Data

US 2020/0028460 A1    Jan. 23, 2020

(30) Foreign Application Priority Data

Jul. 17, 2018  (KR) .......................... 10-2018-0082880

(51) Int. Cl.
*H02P 21/05*    (2006.01)
*H02P 21/00*    (2016.01)
(Continued)

(52) U.S. Cl.
CPC .............. *H02P 21/05* (2013.01); *H02M 1/08* (2013.01); *H02M 7/53871* (2013.01);
(Continued)

(58) Field of Classification Search
CPC .......... H02P 21/22; H02P 27/08; H02P 21/18; H02P 21/00; H02P 2205/01; H02P 21/05; H02P 21/16; H02P 21/24; H02P 27/12; H02M 7/5395; H02M 7/53875; H02M 1/08; H02M 7/53871
See application file for complete search history.

(56) References Cited

U.S. PATENT DOCUMENTS

| | | | | |
|---|---|---|---|---|
| 6,958,589 B2 * | 10/2005 | Kawaji | ................. | H02P 27/045 |
| | | | | 318/438 |
| 7,495,410 B2 * | 2/2009 | Zargari | ............... | H02M 1/4216 |
| | | | | 318/438 |

(Continued)

FOREIGN PATENT DOCUMENTS

| | | |
|---|---|---|
| JP | 2014-018052 A | 1/2014 |
| JP | 5577799 B2 | 8/2014 |

(Continued)

OTHER PUBLICATIONS

Extended European Search Report dated Jun. 24, 2019 issued in European Patent Application No. 18207855.0.

*Primary Examiner* — Thai T Dinh
(74) *Attorney, Agent, or Firm* — Morgan, Lewis & Bockius LLP

(57) ABSTRACT

An apparatus for controlling an inverter for driving a motor including a processor which includes: a current processor configured to generate a voltage command for allowing a current detection value, generated by measuring a current provided from an inverter to a motor, to follow a current command for driving the motor; a voltage modulator configured to generate a pulse width modulation signal for controlling on and off states of a switching element within the inverter with a predetermined switching frequency based on the voltage command; and a frequency determining processor configured to randomly change the switching frequency based on driving information of the motor.

12 Claims, 6 Drawing Sheets

(51) Int. Cl.
*H02P 21/16* (2016.01)
*H02P 21/18* (2016.01)
*H02P 21/22* (2016.01)
*H02P 27/12* (2006.01)
*H02M 1/08* (2006.01)
*H02M 7/5387* (2007.01)
*H02M 1/00* (2006.01)
*H03K 3/84* (2006.01)
*H03K 4/06* (2006.01)
*H03K 3/017* (2006.01)

(52) U.S. Cl.
CPC .......... *H02P 21/0017* (2013.01); *H02P 21/16* (2016.02); *H02P 21/18* (2016.02); *H02P 21/22* (2016.02); *H02P 27/12* (2013.01); *H02M 2001/0009* (2013.01); *H02M 2001/0012* (2013.01); *H03K 3/017* (2013.01); *H03K 3/84* (2013.01); *H03K 4/06* (2013.01)

(56) References Cited

U.S. PATENT DOCUMENTS

| | | | |
|---|---|---|---|
| 8,525,465 B2 * | 9/2013 | Chiu | G05B 19/39 318/437 |
| 8,610,388 B2 * | 12/2013 | Ito | H02P 6/185 318/400.14 |
| 2005/0007061 A1 * | 1/2005 | Hofmann | H02P 9/30 318/701 |
| 2008/0097664 A1 * | 4/2008 | Aoyama | H02J 7/1423 701/36 |
| 2011/0172859 A1 | 7/2011 | Sankaran et al. | |
| 2012/0286716 A1 | 11/2012 | Ohsugi | |
| 2013/0169206 A1 * | 7/2013 | Suhama | H02P 27/085 318/400.24 |
| 2013/0317630 A1 * | 11/2013 | Schulz | H02P 23/04 700/73 |
| 2014/0225539 A1 * | 8/2014 | Omata | H02P 29/027 318/400.02 |
| 2015/0229247 A1 * | 8/2015 | Nakai | H02P 21/06 318/400.02 |
| 2015/0236632 A1 * | 8/2015 | Marohl | H02P 21/22 318/722 |

FOREIGN PATENT DOCUMENTS

| | | |
|---|---|---|
| KR | 2001-0073638 A | 8/2001 |
| KR | 10-2010-0062638 A | 6/2010 |
| KR | 10-2017-0097511 A | 8/2017 |

\* cited by examiner

APPARATUS AND METHOD FOR CONTROLLING INVERTER FOR DRIVING MOTOR

CROSS REFERENCE TO RELATED APPLICATION

The present application claims priority of Korean Patent Application No. 10-2018-0082880 filed on Jul. 17, 2018, the entire contents of which is incorporated herein for all purposes by this reference.

TECHNICAL FIELD

The present disclosure relates to an apparatus and a method for controlling an inverter for driving a motor, and more particularly, to an apparatus and a method for controlling an inverter for driving a motor capable of minimizing a reduction in controllability and efficiency of the motor and reducing switching noise by randomly changing a pulse width modulation frequency of the inverter.

BACKGROUND

In general, a system for driving a motor may include a power storage device (for example, a battery), an inverter for converting DC power stored in the power storage device into three-phase AC power for driving the motor, the motor, and a controller for controlling switching of an inverter based on a current command, generated based on a torque command for driving the motor, and actually measured current, provided to the actual motor.

The inverter may include a plurality of switching elements, and generate AC power by controlling the switching elements in a Pulse Width Modulation (PWM) type. The AC power, generated by the inverter, is provided to the motor and thus the motor operates.

When the pulse width modulation signal for controlling the switching elements within the inverter has a fixed frequency, the control may be simplified and thus controllability may be excellent and the motor driving system may be generally stably controlled. However, when the inverter is controlled by the pulse width modulation signal having the fixed frequency, a strong high frequency component appears in a band corresponding to an integer multiple of the switching frequency and electronic noise and vibration may occur.

In order to solve the disadvantage of the pulse width modulation signal having the fixed switching frequency, a Random Pulse Width Modulation (RPWM) scheme of instantaneously distributing the switching frequency band has been known. When the random pulse width modulation scheme is applied, noise or vibration may be suppressed through energy distribution but the switching frequency may be randomly changed, so that controllability may deteriorate.

The matters which have been described as the technology corresponding to the background of the present disclosure are only for assisting with an understanding of the background of the present disclosure, and should not be considered as the prior art already known to those skilled in the art.

SUMMARY

The present disclosure has been made in order to solve the above-mentioned problems in the prior art and an aspect of the present disclosure is to provide an apparatus and a method for controlling an inverter for driving a motor capable of minimizing a reduction in controllability and efficiency of the motor and reducing switching noise by randomly changing a pulse width modulation frequency of the inverter, which provides driving power to the motor, and configuring a proper change width of the pulse width modulation frequency in consideration of various environments and factors in which the motor is driven.

According to an exemplary embodiment of the present disclosure, an apparatus for controlling an inverter for driving a motor includes: a current controller configured to generate a voltage command for allowing a current detection value, generated by measuring a current provided from an inverter to a motor, to follow a current command for driving the motor; a voltage modulator configured to generate a pulse width modulation signal for controlling on and off states of a switching element within the inverter with a predetermined switching frequency based on the voltage command; and a frequency determining processor configured to randomly change the switching frequency based on driving information of the motor.

The frequency determining processor may determine a change width of the switching frequency based on the driving information and randomly change the switching frequency within the determined change width.

The frequency determining processor may include: a random band generator configured to determine a change width of the switching frequency based on the driving information; a random number generator configured to randomly determine a constant within a preset range; a basic frequency generator configured to generate a basic frequency which is a reference for determining the switching frequency; and an adder configured to determine the switching frequency by adding the basic frequency, generated by the basic frequency generator and a value, generated by multiplying the change width, determined by the random band generator, and the constant, generated by the random number generator.

The random band generator may include: a cost function calculator configured to calculate one cost value by a cost function having various input driving information as parameters; and a data map configured to store in advance the frequency change width mapped to the cost value, receive the cost value, calculated by the cost function calculator, and output a frequency change width mapped to the cost value.

The random band generator may include: a plurality of cost function calculators comprising cost functions having various input driving information as parameters and configured to calculate cost values for the driving information; and a data map configured to store in advance the frequency change width mapped to the cost value, receive a maximum value among cost values calculated by the plurality of cost function calculators, and output a frequency change width mapped to the maximum value.

The driving information may include at least one of the current command, the current detection value, temperature of the inverter, temperature of the motor, and a speed of the motor.

The cost function calculator may include a cost function configured to output a larger cost value as the input driving information is changed to further deteriorate a controllability of the motor, and the data map may perform mapping such that as the cost values become larger, the frequency change width is further reduced.

The random number generator may randomly determine a constant within a range from −1 to 1.

The apparatus may further include a voltage modulator configured to generate a carrier signal in a triangle wave form having a frequency corresponding to the switching frequency, compare the voltage command and the carrier signal, and generate the pulse width signal in a square wave form.

According to another exemplary embodiment of the present disclosure, a method of controlling an inverter for driving a motor includes steps of: generating a basic frequency, which is a reference for determining a switching frequency of switching elements within the inverter; determining a frequency change width for changing the switching frequency based on driving information of the motor, which is driven by receiving driving power from the inverter; randomly determining a constant within a preset range; and determining the switching frequency by adding the basic frequency and a value, generated by multiplying the frequency change width and the constant.

The method further comprising generating a carrier signal in a triangle wave form having a frequency corresponding to the switching frequency, determined in the determining of the frequency switching, comparing the carrier signal with a voltage command, determined to allow a current detection value, generated by measuring current provided from the inverter to the motor, to follow a current command for driving the motor, and generating a pulse width modulation signal in a square wave form.

The determining of the frequency change width may include calculating one cost value by a cost function having various driving information as parameters, inputting the calculated cost value into a data map for storing in advance the frequency change width mapped to the cost value, and determining the frequency change width.

The determining of the frequency change width may include calculating a plurality of cost values by respective cost functions having various driving information as parameters, inputting a maximum value among the plurality of cost values into a data map for storing in advance the frequency change width mapped to the cost value, and determining the frequency change width.

The driving information may include at least one of the current command, the current detection value, temperature of the inverter, temperature of the motor, and a speed of the motor.

The cost function may output a larger cost value as the driving information is changed to further deteriorate a controllability of the motor, and the data map may perform mapping such that as the cost values become larger, the frequency change width is further reduced.

The determining of the constant may include randomly determining the constant within a range from −1 to 1.

According to the exemplary embodiments of the present disclosure, there is an effect of randomly changing a switching frequency of the inverter, so as to prevent a strong high frequency component from being generated in a particular frequency, thereby significantly reducing switching noise.

Particularly, the apparatus and method for controlling an inverter for driving a motor receive a plurality of pieces of motor driving information and determine a change width of a switching frequency, which influences controllability, in consideration of the motor driving information, thereby maintaining proper controllability even in a state in which the controllability deteriorates such as a state in which a difference between a motor current command and actual current, provided to the motor, is large or a state in which temperature of the motor or the inverter excessively rises.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Hereinafter, an apparatus and a method for controlling an inverter for driving a motor according to various embodiments will be described in more detail with reference to the accompanying drawings.

Figure 1:
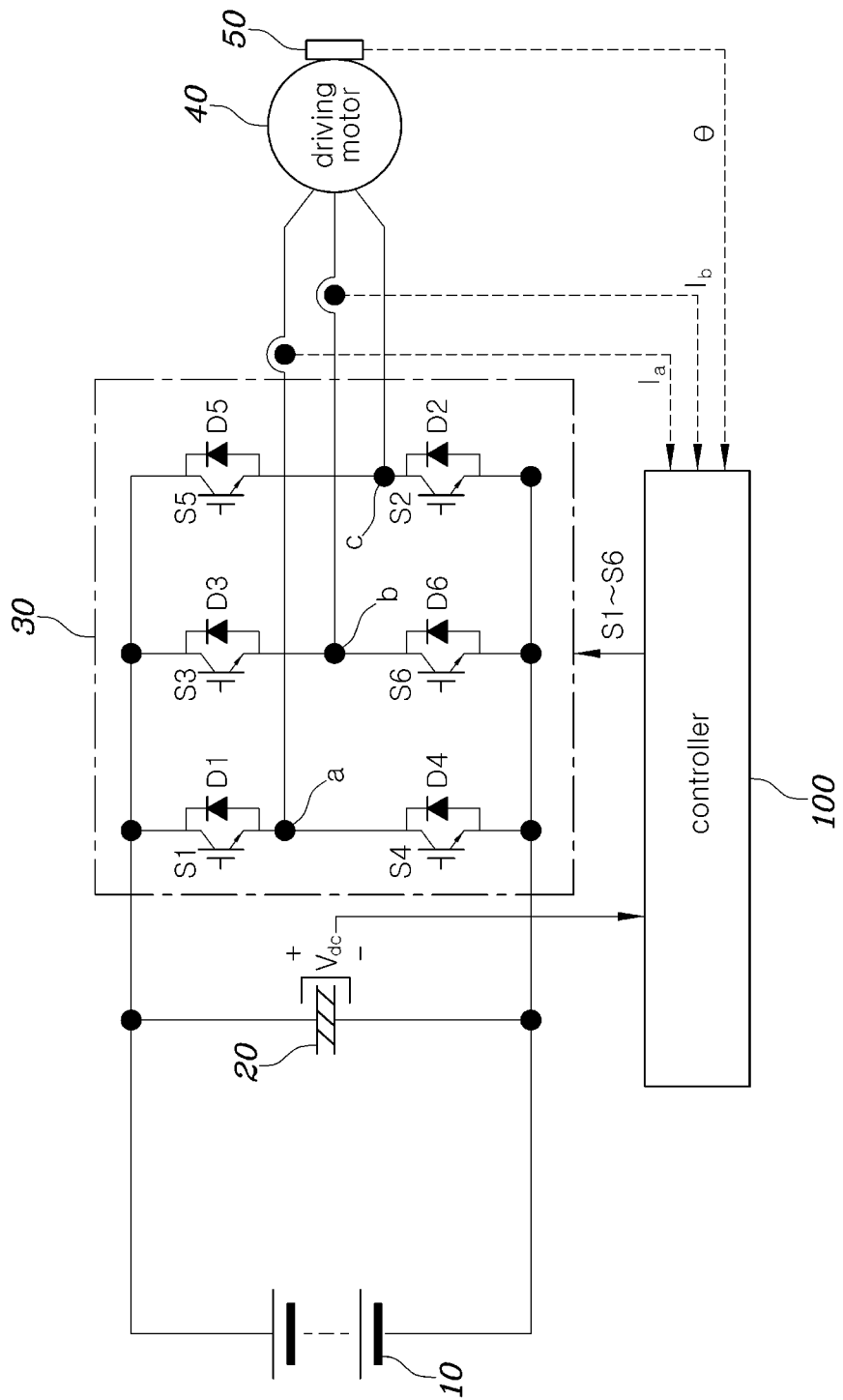
FIG. 1 is a circuit diagram illustrating a motor-driving system to which an inverter control device and method for driving a motor are applied according to an embodiment of the present disclosure.

FIG. 1 is a circuitry diagram illustrating a motor driving system to which an inverter control device for driving a motor is applied according to an embodiment of the present disclosure.

Referring to FIG. 1, the motor driving system to which the inverter control device for driving the motor is applied, according to an embodiment of the present disclosure may include an energy storage device 10, a DC link capacitor 20 connected between both sides of the energy storage device, an inverter 30, a motor 40, a rotation angle sensor 50, and a controller 100.

The energy storage device 10 is an element for storing electric energy for driving the motor 40, such as a battery, in a DC form and outputs DC power.

The DC link capacitor 20 is connected to both sides of the energy storage device 10 and forms a DC link voltage (Vdc) by charging thereof. The DC link voltage (Vdc) becomes an input voltage of the inverter 30.

The inverter 30 is an element for converting DC power stored in and provided by the energy storage device 10 into AC power for driving the motor and may include a plurality of switching elements S1 to S6 of which on/off states are controlled by a pulse width modulation signal provided by the controller 100. Switching of the inverter 30 may be understood as switching of a three-phase voltage output by the inverter.

The motor 40 is an element for receiving three-phase DC power provided from the inverter 30 to generate torque and may include various types of motors known in the art. In an eco-friendly car, the motor is a motor providing torque to driving wheels of the car and may be referred to as a driving motor.

The rotation angle sensor 50 is an element for detecting a location of a rotor of the motor, that is, a rotation angle of the rotor of the motor and may detect an angle of the rotor of the motor 40 and successively output rotation angle detection signals including information on the detected rotation angle of the rotor. For example, the rotation angle sensor 50 may be implemented as a resolver.

The controller 100 may basically perform a control in a pulse width modulation type in which a duty cycle (duty ratio) of the switching elements S1 to S6 of the inverter 30 is properly adjusted in order to control torque of the motor 40 to be a desired value (torque command). For the control, the controller 100 derives information related to torque of the motor 40 which is being driven based on a signal provided from the rotation angle sensor 50 and values ($I_a$, $I_b$) of the detected current provided to the motor 40. Subsequently, the controller 100 controls the switching elements S1 to S6 within the inverter 30 to allow the motor 40 to output a value corresponding to the torque command based on a result of comparison between the torque command (a target torque value desired to be acquired through the motor 40) of the motor 40 input from the outside and the information related to torque of the currently driven motor 40.

In the present disclosure, the current controller 100 may be a processor for operating and controlling by a predetermined program.

According to an embodiment of the present disclosure, the controller 100 generates a pulse width modulation signal by applying a Random Pulse Width Modulation (RPWM) method of randomly determining a frequency of a pulse width modulation signal for controlling on/off of the switching elements S1 to S6 within the inverter 30. Particularly, the controller 100 properly determines a frequency change width of the pulse width modulation signal by using various pieces of motor driving information in order to minimize reduction in controllability and efficiency of the motor and reduce switching noise by frequency concentration through the application of the random pulse width modulation method.

In the system illustrated in FIG. 1, the controller 100 may be an inverter control device according to the present disclosure and an inverter control method performed by the controller 100 may be an inverter control method according to the present disclosure.

Figure 2:
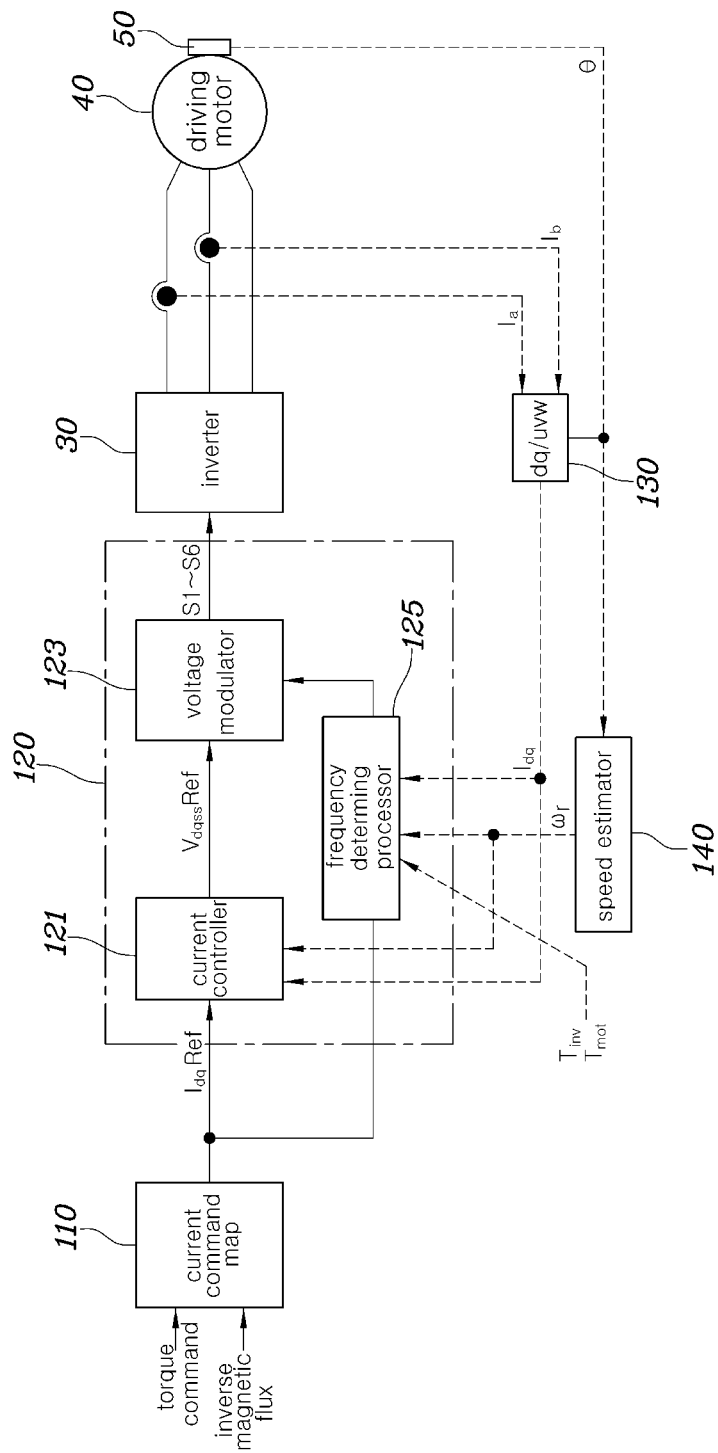
FIG. 2 is a block diagram illustrating in more detail an apparatus for controlling an inverter for driving a motor according to an embodiment of the present disclosure.

FIG. 2 is a block diagram illustrating the inverter control device for driving the motor according to an embodiment of the present disclosure in more detail, and may be understood as a system including the detailed configuration of the controller 100 in FIG. 1, the inverter 30 controlled by the controller 100, and the motor 40 driven by receiving the three-phase voltage from the inverter 30.

Referring to FIG. 2, the inverter control device (the controller 100 of FIG. 1) for driving the motor according to an embodiment of the present disclosure may include a current command map 110 for receiving a torque command input from the outside and inverse magnetic flux of the motor and outputting a current command ($I_{dq}$REF) of the motor corresponding to the input, a current control task unit 120 for comparing the current command ($I_{dq}$REF) and a current detection value generated by detecting the current provided to the motor 40 to generate a voltage command ($V_{dqss}$REF) for making the current detection value follow the current command ($I_{dq}$REF) and generating a gate signal for controlling on/off of the switching elements S1 to S6 through pulse width modulation to generate the output of the inverter 20 corresponding to the voltage command ($V_{dqss}$REF), a coordinate converter 130 for converting a value generated by detecting phase current (Ia, Ib) provided to the motor 40 into d/q axis current ($I_{dq}$), and a speed estimator 140 for deriving a rotation speed of the motor 40 using a location of a motor rotor detected by the rotation angle sensor 50. Here, the speed estimator 140 may be include control logics.

The current command map 110 may store in advance the current command ($I_{dq}$REF) mapped both to the torque command for the motor 40 and the inverse magnetic flux of the motor 40. Accordingly, the current command map 110 receives a torque command of the motor input by an external upper controller and a value generated by detecting the inverse magnetic flux output from the motor and outputs the current command ($I_{dq}$REF) corresponding thereto. The current command ($I_{dq}$REF) may have a form of a d/q axis current command on a rest frame.

According to an embodiment of FIG. 2, it is described that the current command map 110 outputs the current command ($I_{dq}$REF) mapped to the two values which correspond to inputs including the torque command for the motor 40 and the inverse magnetic flux of the motor 40, but it is only an example and the current command map 110 may output a current command using a map in which the current command is mapped to other types of input values. Further, the current command map 110 is only an example of the method which can be applied to generate the current, and the current command may be derived by a method other than the map, for example, calculations performed by putting a particular input value into a preset equation.

The current control task unit 120 may include a current controller 121, a voltage modulator 123, and a frequency determining processor 125.

In the present disclosure, each of the current controller 121, the voltage modulator 123, and frequency determining processor 125 may be implemented as a processor such as a central processing unit (CPU) in an electronic circuitry within a computer that carries out instructions of a computer program by performing arithmetic, logical, control, and input/output (I/O) operations specified by the instruction.

Further, the current control task processor 120 including the current controller 121, the voltage modulator 123, and the frequency determining processor 125 may be embedded in the controller 100 as one controller.

The current controller 121 may receive the d/q axis current command ($I_{dq}$REF) from the current command map 110, receive a value ($I_{dq}$) generated by converting the current detection value (Ia, Ib) generated by actually measuring the current provided from the coordinate converter 130 to the motor into the d/q axis current, and receive a rotation speed (rotation frequency) ($\omega_r$) of the motor estimated by the speed estimator 140. The current controller 121 may generate the voltage command ($V_{dqss}$Ref) based on provided information.

More specifically, the current controller 121 may generate the voltage command ($V_{dqss}$Ref) on the basis of a difference component between the d/q axis current command ($I_{dq}$REF) output from the current command map 110 and the actually measured d/q axis current ($I_{dq}$). Particularly, the current controller 121 may be implemented in a form of a proportional integral (PI) controller and may generate the d/q axis voltage command ($V_{dqss}$Ref) for controlling the actually measured d/q axis current ($I_{dq}$) to follow the current command ($I_{dq}$REF) through proportional integral of the difference component between the d/q axis current command ($I_{dq}$REF) and the actually measured d/q axis current ($I_{dq}$).

The voltage modulator 123 receives the voltage command ($V_{dqss}$REF) and a switching frequency (or a carrier frequency) generated by the frequency determining processor 125 and generates a pulse width modulation signal for determining an on/off state of the switching element within the inverter 30 based thereon. For example, the voltage modulator 125 may generate a carrier signal in a form of a triangle wave following the switching frequency (carrier frequency) determined by the frequency determining processor 125 and generate a pulse width modulation signal in a form of a square wave through a comparison between the carrier signal and the d/q axis voltage command ($V_{dqss}$Ref).

The pulse width modulation signal output by the voltage modulator 123 is provided to a gate of each of the switching elements S1 to S6 within the inverter 30 and on/off of the switching elements S1 to S6 is determined, and thus a three-phase AC voltage (three-phase DC) provided from the inverter 30 to the motor 40 may be determined.

The frequency determining processor 125 is an element for determining a switching frequency of the inverter 30 and may randomly determine the switching frequency within a preset range and provide the determined switching frequency to the voltage modulator 123. Particularly, the frequency determining processor 125 may receive various pieces of information related to driving of the motor 40, determine a change width of the switching frequency based on the information, and determine the switching frequency randomly varying within the determined change width.

Figure 3:
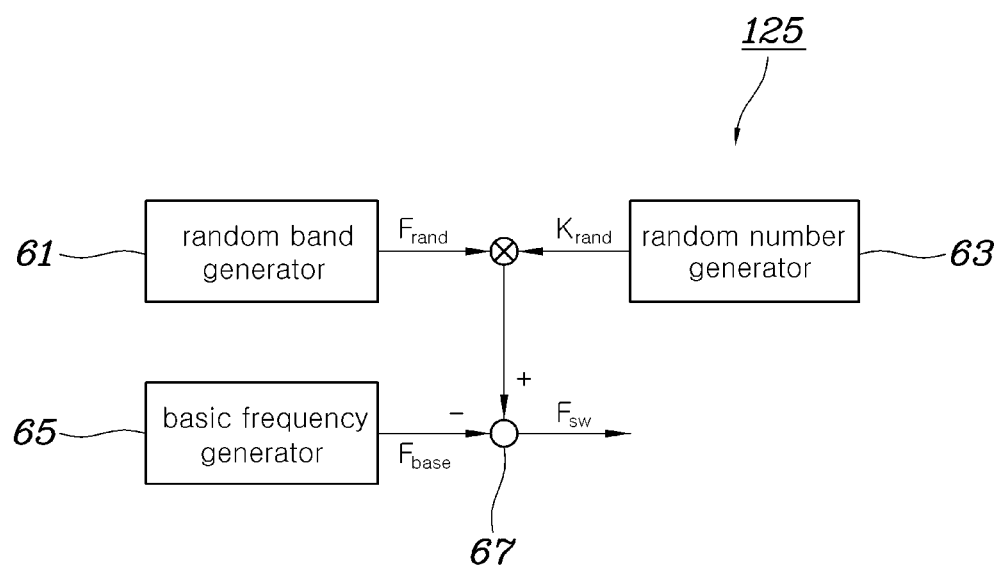
FIG. 3 is a block diagram illustrating in more detail a frequency determining processor of the inverter control device and method for driving the motor according to an embodiment of the present disclosure.

FIG. 3 is a block diagram illustrating the frequency determining processor of the inverter control device for driving the motor according to an embodiment of the present disclosure in more detail.

Referring to FIG. 3, the frequency determining processor 125 may include a random band generator 61 for determining a change width ($F_{rand}$) of the switching frequency for changing the frequency of the pulse width modulation signal, a random number generator 63 for determining a random number ($K_{rand}$), which is a random constant within a range from −1 to 1 multiplied by the change width ($F_{rand}$) of the switching frequency determined by the random band generator 61, a basic frequency generator 65 for generating a basic frequency ($F_{base}$), which is a reference of the switching frequency, and an adder 67 for determining the switching frequency ($F_{sw}$) by adding the frequency, which is determined by multiplying the random number ($K_{rand}$) and the frequency change width ($F_{rand}$), and the basic frequency ($F_{base}$).

The frequency determining processor 125 determines the switching frequency ($F_{sw}$) randomly changed by adding the basic frequency ($F_{base}$) determined by the basic frequency generator 65 and a random frequency change value. The basic frequency generator 65 may determine the basic switching frequency through a switching frequency determination method applied to another pulse width modulation scheme for generating a pulse width modulation signal with a fixed switching frequency.

The random frequency change value is changed within a predetermined change width. To this end, the random band generator 61 randomly determines the frequency variable value within the frequency change width by setting the frequency change width ($F_{rand}$) and multiplying the random number ($K_{rand}$) having a value from −1 to 1 by the set change width.

The switching frequency ($F_{sw}$), determined by adding the basic frequency ($F_{base}$) and the frequency variable value ($K_{rand} \times F_{rand}$) by the adder 67, is provided to the voltage modulator 123, and the voltage modulator generates a pulse width modulation signal having a frequency corresponding to the switching frequency ($F_{sw}$) (corresponding to the carrier frequency). As described above, the voltage modulator 123 may generate a carrier signal in a form of a triangle wave following the switching frequency ($F_{sw}$) (carrier frequency), determined by the frequency determining processor 125, and generate a pulse width modulation signal in a form of a square wave through a comparison between the carrier signal and the d/q axis voltage command ($V_{dqss}$Ref).

Meanwhile, according to an embodiment of the present disclosure, the frequency change width may be determined using at least some of pieces of motor driving information such as a motor driving environment or control state. That is, the random band generator 61 may receive the motor driving information and determine the frequency based thereon.

Figure 4:
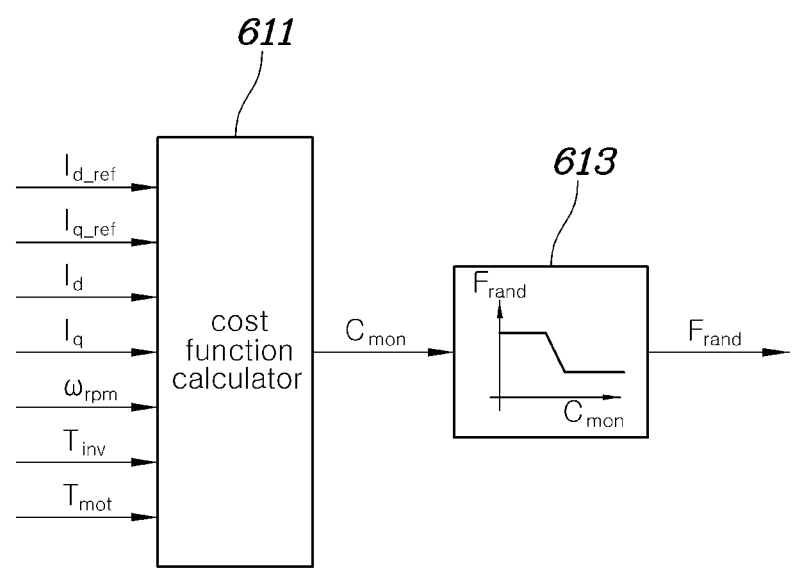
FIGS. 4 and 5 are block diagrams illustrating in more detail several examples of a random band generator for determining a frequency change width in the inverter control device for driving the motor according to an embodiment of the present disclosure.
Figure 5:
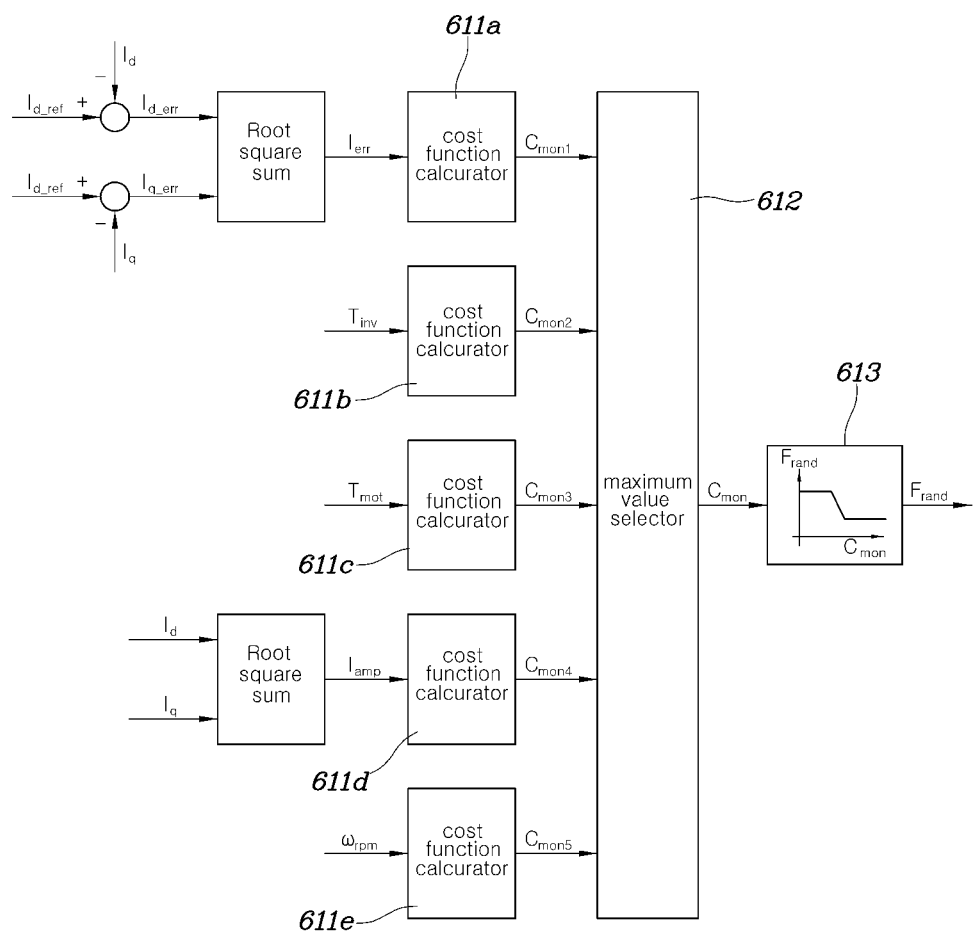

FIGS. 4 and 5 are block diagrams illustrating several examples of the random band generator for determining the frequency change width in the inverter control device for driving the motor according to an embodiment of the present disclosure.

First, referring to FIG. 4, the random band generator 61 may include a cost function calculator 611 for receiving various pieces of motor driving information and generating a cost value ($C_{mon}$), which is a reference for determining the frequency change width ($F_{rand}$), based on one cost function having each piece of the received motor driving information as a parameter, and a data map 613 for storing in advance the frequency change width ($F_{rand}$) mapped to the cost value ($C_{mon}$) and outputting the frequency change width ($F_{rand}$) mapped to the cost value ($C_{mon}$), calculated and input by the cost function calculator 611.

The motor driving information input to the cost function calculator 611 may include a d/q current command ($I_{d\_ref}$, $I_{q\_ref}$) corresponding to the torque command for driving the motor, a current detection value ($I_d$, $I_q$) generated by detecting the current provided from the inverter 30 to the motor 40, a rotation speed ($\omega_{rpm}$) of the motor 40, temperature ($T_{inv}$) of the inverter 30, and temperature ($T_{mot}$) of the motor 40.

The cost function calculator 611 may include a cost function for generating a reference value (cost value) by which the proper switching frequency change width ($F_{rand}$) can be determined using various pieces of input motor driving information. The cost function is an equation having the received motor driving information as a parameter and may provide a weighted value to each type of the motor driving information.

The data map 613 may store in advance the frequency change width ($F_{rand}$) mapped to the cost value ($C_{mon}$), and when the cost value ($C_{mon}$) is input, output the frequency change width ($F_{rand}$) mapped to the input cost value ($C_{mon}$). The frequency change width ($F_{rand}$) in the data map 613 may have a limitation on a very low cost value or a very high cost value. That is, the frequency change width ($F_{rand}$) may have a maximum value or a minimum value, set in advance, and may be properly determined within a range between the maximum value and the minimum value according to a cost value. The maximum value of the frequency change width ($F_{rand}$) may be a value by which a maximum switching frequency for stably controlling the motor 40 can be generated, and the minimum value of the frequency change width ($F_{rand}$) may be 0, in which case the switching frequency is set as a default frequency and not be variable.

Referring to FIG. 5 in which another example of the random band generator 61 is illustrated, the random band generator 61 may include a plurality of cost function calculators 611a to 611e for individually calculating cost functions for respective pieces of motor driving information such as the d/q current command ($I_{d\_ref}$, $I_{q\_ref}$), the d/q current detection value ($I_d$, $I_q$) generated by detecting the current provided from the inverter 30 to the motor 40, the rotation speed ($\omega_{rpm}$) of the motor 40, the temperature ($T_{inv}$) of the inverter 30, and the temperature ($T_{mot}$) of the motor 40, a maximum value selector 612 for selecting a maximum value from among cost values ($C_{mon1}$ to $C_{mon5}$) calculated by the cost function calculators 611a to 611e, and a data map 613 for storing the frequency change width ($F_{rand}$) mapped to the cost value ($C_{mon}$) in advance, receiving a cost value selected by the maximum value selector 612, and outputting the frequency change width ($F_{rand}$) corresponding to the selected cost value. Here, the maximum value selector 612 may be include control logics.

Unlike the example illustrated in FIG. 4, in the example illustrated in FIG. 5, a plurality of cost values may be calculated by individually applying the cost function calculators 611a to 611e to the value calculated using each piece of some pieces of the plurality of input motor driving information and then the frequency change width ($F_{rand}$) for the maximum value among the calculated cost values ($C_{mon1}$ to $C_{mon5}$) may be determined.

For example, the first cost function calculator 611a may calculate, as a parameter, a cost value through a cost function having an average value ($I_{err}$) of difference values between the d/q current command ($I_{d\_ref}$, $I_{q\_ref}$) and the d/q current detection value ($I_d$, $I_q$) generated by measuring the current provided from the inverter 30 to the motor 40. The second cost function calculator 611b may calculate a cost value through a cost function having the inverter temperature ($T_{inv}$) as a parameter, and the third cost function calculator 611c may calculate a cost value through a cost function having the motor temperature ($T_{mot}$) as a parameter. Further, the fourth cost function calculator 611d may calculate a cost value through a cost function having an average ($I_{amp}$) of the d/q current detection value as a parameter, and the fifth cost function calculator 611e may calculate a cost value through a cost function having the rotation speed ($\omega_{rpm}$) of the motor 40 having a parameter.

In order to determine a switching frequency change width in consideration of information that is most greatly influenced by a random change of the switching frequency among the calculated cost values, the maximum value selector 612 may select a maximum value among the plurality of cost values ($C_{mon1}$ to $C_{mon5}$) and determine the frequency change width ($F_{rand}$) based on the data map 613 having a cost value corresponding to the maximum value as an input like in the description of FIG. 4.

In FIGS. 4 and 5, the cost function may output a larger cost value as the input motor driving information is changed to further deteriorate a controllability of the motor, and the data map may perform data mapping such that as the input cost values become larger, the frequency change width ($F_{rand}$) is further reduced. For example, as the average value of difference values between the d/q current command ($I_{d\_ref}$, $I_{q\_ref}$) and the d/q current detection value ($I_d$, $I_q$) generated by measuring the current provided from the inverter 30 to the motor becomes larger, the motor control may not be performed properly. In this case, as the average value ($I_{err}$) is larger, the cost value may increase and the frequency change width output from the data map may decrease. That is, according to an embodiment of the present disclosure, it is possible to improve the control while an effect of a noise decrease by reducing the frequency change width in a condition in which an increase in the control is required. For example, driving information for reducing the control may include an increase in the inverter temperature ($T_{inv}$), an increase in the motor temperature ($T_{mot}$), an increase in the average ($I_{amp}$) of the d/q current detection value, and an increase in the motor rotation speed ($\omega_{rpm}$). As the control is reduced by the driving information, the cost value may increase and accordingly the frequency change width ($F_{rand}$) may decrease.

The frequency change value is determined by multiplying the frequency change width ($F_{rand}$), determined by the random band generator 61, and the random number ($K_{rand}$) within the range from −1 to 1, generated by the random number generator 63, and the switching frequency ($F_{sw}$) is determined by adding the basic frequency ($F_{base}$), generated by the basic frequency generator 65 and the frequency change value, which may be implemented by the example illustrated in FIG. 4 or 5.

The present disclosure also provides an inverter control method using the inverter control device for driving the motor.

Figure 6:
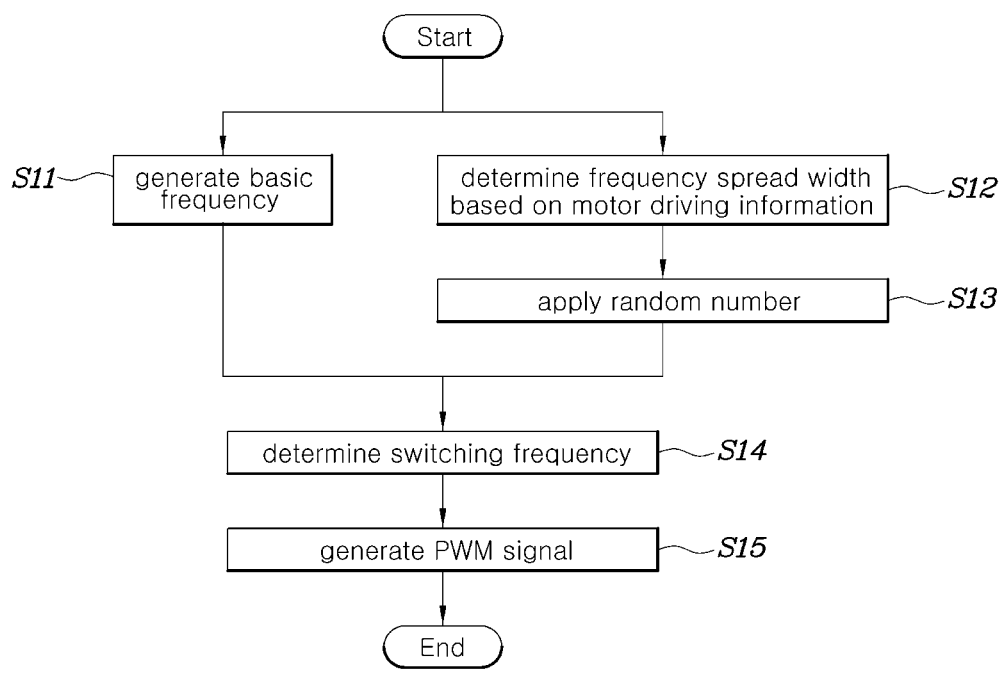
FIG. 6 is a flowchart illustrating the inverter control method for driving the motor according to an embodiment of the present disclosure.

FIG. 6 is a flowchart illustrating the inverter control method for driving the motor according to an embodiment of the present disclosure.

Referring to FIG. 6, the inverter control method for driving the motor according to an embodiment of the present disclosure starts at step S11 in which the basic frequency generator 65 generates the basic frequency ($F_{base}$) for switching the inverter 30 and step S12 in which the random band generator 61 receives motor driving information and determines the frequency change width ($F_{rand}$). The control, such as the general inverter control, for example, generating a current command based on a torque command of the motor 40 input from the outside and generating a voltage command by comparing the current command with a current detection value generated by detecting actual current provided to the motor 40, may be also performed immediately when the motoring driving is initiated.

In step S11 of generating the basic frequency ($F_{base}$) f the basic frequency may be generated through a method applied to a pulse width modulation scheme in which a fixed switching frequency is applied as well as a random pulse width modulation scheme.

Further, in step S12, a scheme of generating one cost value based on a plurality of pieces of motor driving information as parameter and then determining the frequency change width ($F_{rand}$) corresponding to the cost value on the basis of the data map or a scheme of generating a cost value for each of the plurality of pieces of motoring driving information and then determining the frequency change width ($F_{rand}$) corresponding to a maximum value among a plurality of cost values may be selectively applied, as illustrated with reference to FIGS. 4 and 5.

Further, the random number generator 63 may generate a random number ($K_{rand}$) having a random number within a range from −1 to 1 in parallel to steps S11 and S12, and may determine a frequency change value by multiplying the frequency change width ($F_{rand}$) and the random number ($K_{rand}$) in step S13.

The adder 67 adds the basic frequency ($F_{base}$) and the frequency change value to determine the switching frequency ($F_{sw}$) of the pulse width modulation signal for controlling the inverter 30 and provide the determined switching frequency ($F_{sw}$) to the voltage modulator 123 in S14.

The voltage modulator 123 receives the voltage command ($V_{dqss}REF$) and the switching frequency ($F_{sw}$) (or a carrier frequency), generated by the adder 67, and generates a pulse width modulation signal for determining an on/off state of the switching element within the inverter 30 based on the switching frequency ($F_{sw}$) in S15. As described above, in S15, the voltage modulator 123 may generate a carrier signal in a triangle waveform corresponding to the switching frequency ($F_{sw}$) (carrier frequency), generated by the adder 67, and generate a pulse width modulation signal in a square wave form through a comparison between the carrier signal and the d/q axis voltage command ($V_{dqss}$Ref).

The pulse width modulation signal, generated by the voltage modulator 123, may be provided to gates of the switching elements S1 to S6 within the inverter 30 and thus on/off states of the switching elements S1 to S6 may be controlled.

A series of control flows illustrated in FIG. 6 is continuously repeated while the motor is driven, so that the switching frequency may be randomly determined whenever the control flow is repeated.

As described above, the apparatus and method for controlling the inverter for driving the motor according to various embodiments of the present disclosure may randomly change the switching frequency of the inverter, so as to prevent a strong high frequency component from being generated in a particular frequency, thereby significantly reducing switching noise.

Particularly, the apparatus and method for controlling the inverter for driving the motor according to various embodiments of the present disclosure may receive a plurality of pieces of motor driving information and determine a change width of the switching frequency, which influences controllability, based on the motor driving information, and thus maintain proper controllability even in a state in which the control of the motor is reduced (for example, a state in which a difference between a motor current command and actual current provided to the motor is large or a state in which temperature of the motor or the inverter excessively rises).

Although particular embodiments of the present disclosure have been illustrated and described, it is apparent to those skilled in the art that the present disclosure can be variously modified and changed without departing from the scope of the present disclosure.

What is claimed is:

1. An apparatus for controlling an inverter for driving a motor, the apparatus comprising a processor including:
   a current processor configured to generate a voltage command for allowing a current detection value, which is generated by measuring a current provided from the inverter to the motor, to follow a current command for driving the motor;
   a voltage modulator configured to generate a pulse width modulation signal for controlling on and off states of a switching element within the inverter with a predetermined switching frequency based on the voltage command; and
   a frequency determining processor configured to randomly change the switching frequency based on driving information of the motor,
   wherein the frequency determining processor comprises:
      a random band generator configured to determine a change width of the switching frequency based on the driving information;
      a random number generator configured to randomly determine a constant within a preset range;
      a basic frequency generator configured to generate a basic frequency which is a reference for determining the switching frequency; and
      an adder configured to determine the switching frequency by adding the basic frequency and a value, which is generated by multiplying the change width of the switching frequency by the constant, and
   wherein the random band generator comprises:
      a cost function calculator configured to calculate a cost value by a cost function having various parameters based on the driving information; and
      a data map configured to:
         store in advance a frequency change width mapped to the cost value,
         receive the cost value, and
         output the frequency change width.

2. The apparatus of claim 1, wherein the frequency determining processor determines the change width of the switching frequency based on the driving information and randomly changes the switching frequency within the determined change width of the switching frequency.

3. The apparatus of claim 1, wherein the driving information includes at least one of the current command, the current detection value, a temperature of the inverter, a temperature of the motor, or a speed of the motor.

4. The apparatus of claim 1, wherein the cost function is configured to output a larger cost value as the driving information is changed to further deteriorate a controllability of the motor, and
   the data map performs mapping such that as the cost value becomes larger, the frequency change width becomes smaller.

5. The apparatus of claim 1, wherein the random number generator randomly determines a constant within a range from −1 to 1.

6. The apparatus of claim 1, further comprising a voltage modulator configured to:
   generate a carrier signal in a triangle wave form having a frequency corresponding to the switching frequency,
   compare the voltage command and the carrier signal, and
   generate the pulse width modulation signal in a square wave form.

7. An apparatus for controlling an inverter for driving a motor, the apparatus comprising a processor including:
   a current processor configured to generate a voltage command for allowing a current detection value, which is generated by measuring a current provided from the inverter to the motor, to follow a current command for driving the motor;
   a voltage modulator configured to generate a pulse width modulation signal for controlling on and off states of a switching element within the inverter with a predetermined switching frequency based on the voltage command; and
   a frequency determining processor configured to randomly change the switching frequency based on driving information, wherein the frequency determining processor comprises:
      a random band generator configured to determine a change width of the switching frequency based on the driving information;
      a random number generator configured to randomly determine a constant within a preset range;
      a basic frequency generator configured to generate a basic frequency which is a reference for determining the switching frequency; and
      an adder configured to determine the switching frequency by adding the basic frequency and a value, which is generated by multiplying the change width of the switching frequency and the constant, wherein the random band generator comprises:
- a plurality of cost function calculators comprising cost functions having various parameters based on the driving information, the plurality of cost function calculators configured to calculate cost values for the driving information; and
- a data map configured to:
  - receive a maximum value among the cost values calculated by the plurality of cost function calculators, and
  - store in advance a frequency change width mapped to the maximum value among the cost values,
  - output the frequency change width.

8. A method of controlling an inverter for driving a motor, the method comprising steps of:
- generating, by a processor, a basic frequency as a reference for determining a switching frequency of switching elements within the inverter;
- determining, by the processor, a frequency change width for changing the switching frequency based on driving information of the motor, which is driven by receiving driving power from the inverter;
- randomly determining, by the processor, a constant within a preset range; and
- determining, by the processor, the switching frequency by adding the basic frequency and a value which is generated by multiplying the frequency change width and the constant,
wherein the step of determining a frequency change width comprises:
- calculating a cost value by a cost function having various parameters based on the driving information;
- inputting the calculated cost value into a data map for storing in advance the frequency change width mapped to the cost value; and
- outputting the frequency change width.

9. The method of claim 8, further comprising steps of:
- generating a carrier signal in a triangle wave form having a frequency corresponding to the determined switching frequency;
- comparing the carrier signal with a voltage command, which is determined to allow a current detection value, generated by measuring current provided from the inverter to the motor, to follow a current command for driving the motor; and
- generating a pulse width modulation signal in a square wave form.

10. The method of claim 8, wherein the driving information includes at least one of a current command for driving the motor, a current detection value, generated by measuring current provided from the inverter to the motor, a temperature of the inverter, a temperature of the motor, or a speed of the motor.

11. The method of claim 8, wherein the cost function outputs a larger cost value as the driving information is changed to further deteriorate a controllability of the motor, and
the data map performs mapping such that as the cost value becomes larger, the frequency change width becomes smaller.

12. The method of claim 8, wherein the step of randomly determining a constant comprises randomly determining the constant within a range from −1 to 1.

* * * * *